United States Patent
Hynecek

(12) 
(10) Patent No.: US 6,608,337 B2
(45) Date of Patent: Aug. 19, 2003

(54) IMAGE SENSOR WITH AN ENHANCED NEAR INFRA-RED SPECTRAL RESPONSE AND METHOD OF MAKING

(75) Inventor: Jaroslav Hynecek, Allen, TX (US)

(73) Assignee: ISE TEX, Inc, Allen, TX (US)

( * ) Notice: Subject to any disclaimer, the term of this patent is extended or adjusted under 35 U.S.C. 154(b) by 175 days.

(21) Appl. No.: 09/833,194

(22) Filed: Apr. 12, 2001

(65) Prior Publication Data

US 2002/0149078 A1 Oct. 17, 2002

(51) Int. Cl.[7] .............................................. H01L 31/113
(52) U.S. Cl. ........................ 257/290; 257/230; 257/233; 257/258; 257/291; 257/292
(58) Field of Search ................................ 257/290, 291, 257/292, 230, 233, 258

(56) References Cited

U.S. PATENT DOCUMENTS

| | | | | |
|---|---|---|---|---|
| 4,866,497 A | * | 9/1989 | Kosonocky | 357/24 |
| 5,614,744 A | * | 3/1997 | Merrill | 257/291 |
| 5,757,008 A | * | 5/1998 | Akagawa et al. | 250/370.08 |
| 6,177,293 B1 | * | 1/2001 | Netzer et al. | 438/73 |
| 6,188,093 B1 | * | 2/2001 | Isogai et al. | 257/230 |

* cited by examiner

*Primary Examiner*—Michael S. Lebentritt
*Assistant Examiner*—Doug Menz
(74) *Attorney, Agent, or Firm*—John E. Vandigriff

(57) ABSTRACT

Image sensors with an enhanced QE and MTF in the NIR spectral region are fabricated on the standard substrates. This is achieved by replacing the p+ type doped layer, typically present under the thick field oxide in the inactive regions of the sensor, with an n+ type doped layer. The n+ type layer, which is biased at the Vdd potential, surrounds the entire image sensor array as a guard ring and is separated from the CCD or CMOS array pixels by a suitable potential barrier. The potential barrier prevents collected charge from escaping into the n+ layer regions. Additional embodiments include output diode and MOS transistor designs that use field plates for creating potential barriers that separate these devices from the n+ type doped field regions.

20 Claims, 3 Drawing Sheets

IMAGE SENSOR WITH AN ENHANCED NEAR INFRA-RED SPECTRAL RESPONSE AND METHOD OF MAKING

FIELD OF THE INVENTION

The present invention relates to solid-state image sensors, specifically to image sensors that have an improved sensitivity and improved modulation transfer function (MTF) in the Near Infra-Red (NIR) spectral region.

BACKGROUND OF THE INVENTION

The state of the art image sensors that have enhanced QE and high MTF in the NIR spectral region are typically fabricated on substrates that have low doping and thus high resistivity. The reason for this choice is to obtain a large depth of the depletion region under the sensor surface. The near IR illumination has a progressively smaller absorption as the wavelength increases and this causes photons to penetrate deeper into the substrate. The generated electrons thus must migrate large distances to the surface where they can be collected in the image sensor pixels. During the process of migration, electrons can spread laterally leading to loss of MTF, or they can be lost completely due to recombination. To minimize these problems the large depletion depth is formed that provides vertical fields, which drive the generated electrons quickly to the surface pixels before they have a chance to spread or recombine.

The use of high resistivity substrates is not without problems, however. It is very difficult to prepare them with sufficient quality, purity, and the required low doping level. The poor quality then causes unpleasant image defects and non-uniformities as well as high dark current. Some improvements can be obtained by device cooling, but this solution is expensive and many times unacceptable due to the large package size and increased power consumption. Tsoi et al. has described the high resistivity approach in: "A Deep-Depletion CCD Imager for Soft X-Ray, Visible, and Near-Infrared Sensing" published in IEEE Transactions on Electron Devices vol. ED-32, No. 8, August 85, pp. 1525–1530. More recently, the high resistivity substrates were discussed by Burke et al. in: "An Abuttable CCD Imager for Visible and X-Ray Focal Plane Arrays" published in the same Journal vol. ED-38, No. 5, May 91, pp. 1069–1076. However, the problems related to the high resistivity issues still remain unsolved.

It is the purpose of this invention to overcome the above-described limitations, and to achieve both high QE and high MTF in the NIR sensitive image sensors without using high resistivity substrates. The prior art does not show how to substantially increase the depletion depth of image sensors by applying a large negative bias to the substrate that has standard doping. The prior art does not teach how to design image sensor arrays and their peripheral devices on the substantially standard substrate materials that are biased with large negative biases.

SUMMARY OF THE INVENTION

The invention relates to the process for fabricating of image sensor arrays that use a large negative substrate bias, to the design of the image sensor arrays themselves, and their peripheral devices such as output diodes, transistors, and buffer amplifiers, which can correctly function on negatively biased substrates.

The present invention provides process modifications that can be used to fabricate image sensors with an enhanced QE and MTF in the NIR spectral region and that are fabricated on the standard substrates. The CCD image device of the invention provides practical high performance image sensor designs of various architectures and with various peripheral devices that have high QE and high MTF in the NIR spectral region.

The improvement to CCD and CMOS image devices achieved by replacing the p+ type doped layer, typically present under the thick field oxide in the inactive regions of the sensor, with an n+ type doped layer. The n+ type layer, which is biased at the Vdd potential, surrounds the entire image sensor array as a guard ring, and is separated from the CCD or CMOS array pixels by a suitable potential barrier. The potential barrier prevents collected charge from escaping into the n+ layer regions.

Additional embodiments include output diode and MOS transistor designs that use field plates for creating potential barriers that separate these devices from the n+ type doped field regions.

In an alternative embodiment an n type region is formed under the p+ type doped inactive regions adjacent to the array and under the channel stop regions of the array. The n type doped region is connected to the n+ type doped guard ring that surrounds the p+ type regions and to the n type buried channel region of the array. The p+ type region is biased at the ground potential, while the guard ring is biased at Vdd potential. Advantage of this arrangement is that pinned photo diodes and Virtual Phase electrodes can be used in the pixel array.

An advantage of the above-described arrangements is that a large negative bias can be supplied to the substrate without substantially affecting the function of the image sensor array and its peripheral devices. The resulting large depletion depth created in the standard concentration epi-layer minimizes problems associated with high resistivity doping while achieving high QE and high MTF.

BRIEF DESCRIPTION OF DRAWINGS

The invention will be described in detail in the following description of preferred embodiments with reference to the following figures wherein.

DETAIL DESCRIPTION OF PREFERRED EMBODIMENTS

Image sensors, both CCDs and Active Pixel CMOS types, are fabricated on standard p-type substrates that have an increased epi-layer thickness. The large depletion layer depth that is necessary for the simultaneous enhancement of MTF and quantum efficiency (QE) is achieved by application of a large negative bias to the substrate rather than by using high resistivity epi-layer doping. The requirement for large negative substrate bias, however, necessitates not only significant process modifications but also design modifications of the sensor array architecture including the modifications of peripheral devices. The invention, as set forth below, therefore, describes in detail the modifications that are necessary in the image sensor arrays that can use a large negative substrate bias, and in the design of the their peripheral devices such as output diodes, transistors, and buffer amplifiers, which can correctly function on negatively biased substrates.

Figure 1:
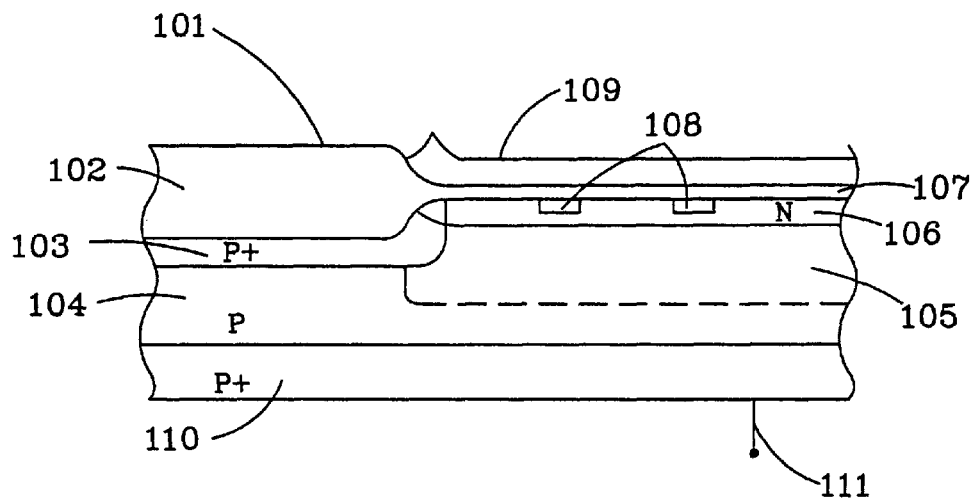
FIG. 1 represents a cross section through a typical prior art CCD image sensor fabricated using the current state of the art process.

A cross section through a portion of the image sensing area 101 of a typical prior art CCD image sensor is shown in FIG. 1. Region 103 represents the device inactive peripheral region that has a thick-filed oxide 102 grown over it. A suitable p+ type doping 103 is placed at the oxide-substrate interface to prevent formation of parasitic channels. The device further consists of a semiconductor region 104 that is p type doped and is formed either from the bulk material or epitaxially grown on a heavier p+ type doped substrate 110. The active area of the image sensor consists of a buried channel doping 106, a thin gate oxide layer 107 and a polysilicon gate 109. Placing p type channel stops 108 close to the oxide-substrate interface defines the CCD channels that run perpendicular to the plane of drawing. Grounding the substrate through the terminal 111 and applying a suitable bias to the gate 109 removes free electrons from the structure and forms the depletion region 105. When photons impinge on the sensor they penetrate into the depletion region 105, and, depending on their wavelengths, further may penetrate into the un-depleted substrate 104. The generated electrons then diffuse up into the CCD channels where they are integrated and stored for readout. Electrons generated in the depletion layer 105 are swept up very quickly since that region possesses large vertical electric fields. On the other hand, electrons generated in the un-depleted region 104 spread also laterally causing a loss on MTF. The electrons can also recombine with holes present in this region, which causes a loss in QE. It is, therefore, desirable to make the depletion region 105 as deep as possible, collect as many electrons as possible, and at the same time prevent horizontal spreading of charge. This has been accomplished in prior art sensors by using a high resistivity material for the layer 104. The high resistivity implies low doping density that allows the depletion layer 105 to spread in depth almost all the way to the interface between the layers 104 and 110. To use the high resistivity material for the region 104, however, poses many problems. It is difficult to fabricate the high resistivity material of the desired doping level and with the necessary quality that is required for the fabrication of image sensors. This leads to unacceptably high dark current and unpleasant blemishes that become visible in the pictures obtained from these sensors.

Figure 2:
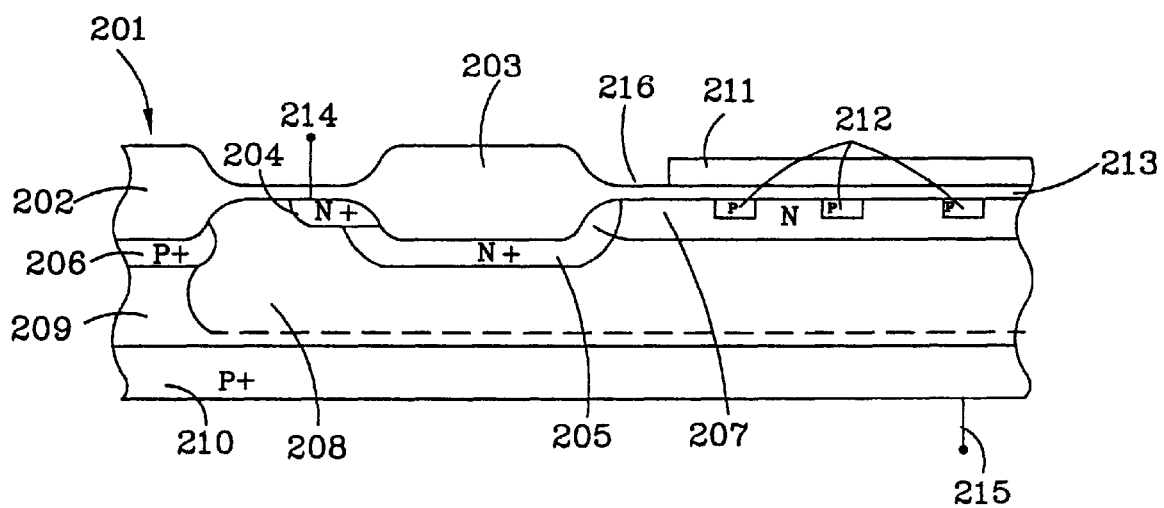
FIG. 2 represents a cross section through the CCD device that has been fabricated using the modified process that allows using a negative bias applied to the substrate.

FIG. 2 represents a cross section 201 of a portion of the same image-sensing array of a CCD image sensor shown in FIG. 1 that has been modified to minimize problems caused by using the high resistivity material. The thick field region 202 with the p+ type doping 206 has been moved away from the image sensing area edge and an additional thick field region 203 has been created surrounding the entire array. The region 203 has an n+type doping 205 at the oxide-substrate interface, which is coupled to the n+ type guard ring 204. A biasing terminal 214 is connected to the n+ type region 204 and is supplying a suitable bias to that region. A suitable bias could, for example, be Vdd. Buried channel region 207, channel stop regions 212, thin gate oxide 213, and gate 211 form the CCD image sensor array structure the same way as in the CCD device previously described in FIG. 1. In the new device, however, it is now possible to supply a large negative bias to the substrate through the terminal 215, which causes the depletion region 208 to significantly increase in its depth. By adjusting the bias voltage, it is also possible to precisely control the depth of the depletion region and to move its boundary almost all the way down to the interface between the p type doped region 209 and the p+ type doped substrate 210. The channel stops 212 may be fully depleted of holes since they serve only as potential barriers to confine the collected charge horizontally. Region 216, between the thick field oxide 203 and the ends of the CCD gates, can also be doped by n+ type doping, or left as is, doped only by the buried channel impurities. No charge is stored in this region. The process modification to form the structure 201 is very simple: Before the thick field oxide 203 is grown, instead of placing the p+ type doping 206 everywhere where the thick oxide will be, an additional region 205 is defined by a mask and doped by the n+ type impurities. The n+ drain 204 may be formed after the thick-filed oxide has been grown using, for example, the n+ type source and drain-doping step for formation of N-MOS transistors. The large negative bias applied to the substrate creates a high field between the p+ type doped region 206 and the n+ type guard ring 204. During the sensor design, some attention has to be paid to this problem to avoid a premature breakdown that could occur there. Any number of known techniques can be used to avoid the low voltage breakdown but these will not be discussed here since they are not relevant to the define structure.

Figure 3:
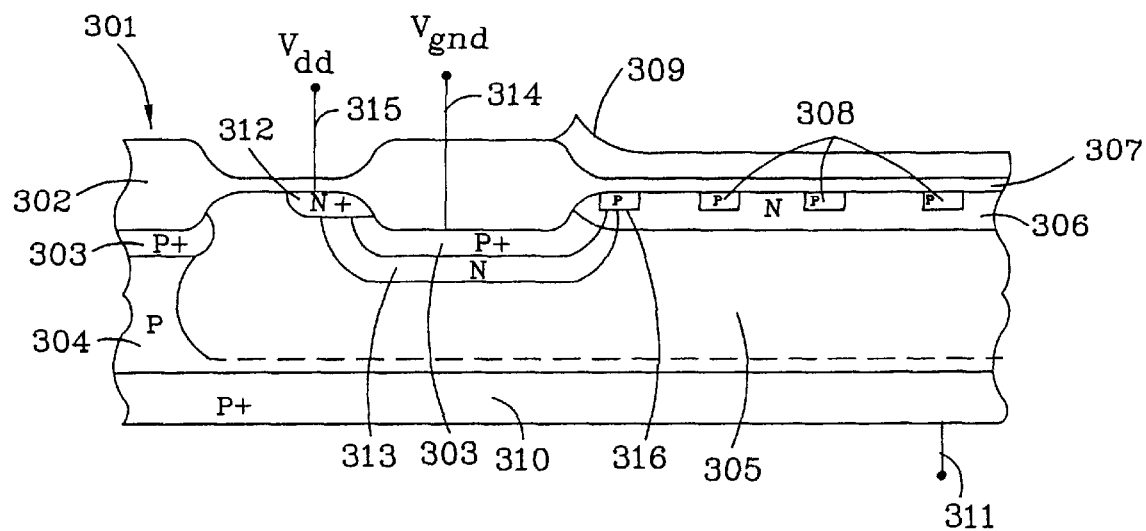
FIG. 3 is another embodiment of the present invention that shows a cross section of the device fabricated using yet another modification to the standard fabrication process that enables incorporation of pinned photo diodes and Virtual Phase electrodes in the array.

FIG. 3 represents another embodiment 301 of the invention where the p+ type doped layer 303, under the thick filed oxide 302, is preserved. To prevent hole injection from this layer to the substrate, another n type doped layer 313 has been included in the structure. The layer 313 is connected to the n+ type guard ring 312 and also to the buried channel 306. Terminal 315 supplies the bias to the guard ring 312. The p+ type layer 303 is connected to a reference potential such as for example ground through the terminal 314. The p+ type layer 303 is also connected to the channel stop region 316 and thus provides the reference bias for that region. The channel stops 316 and 308 thus do not have to be fully depleted of holes and can serve as sources of holes for the pinned photo diodes and Virtual Phase electrodes. The remaining features that include the p type doped region 304, p+ type doped region 310, channel stops 308, the thin gate oxide 307, buried channel 306, and the gate 309 serve here the same purpose as in the structure 201 shown previously in FIG. 2. The depth of the depletion region 305 is now wider and controllable by applying the negative bias to the terminal 311 in the same way as previously explained for the structure 201.

Figure 4:
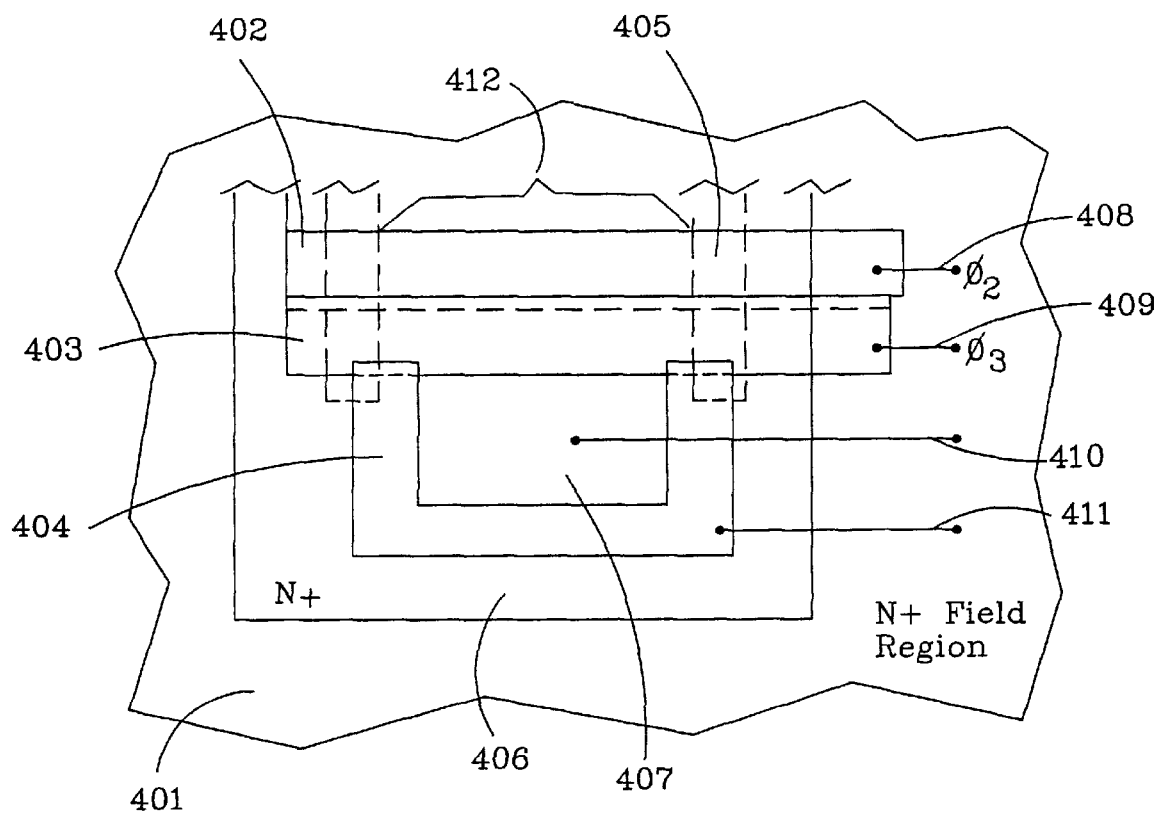
FIG. 4 is a plan view of the CCD image sensor output diode detail showing the field plate electrode that separates the output diode n+ region from the n+ field region.

FIG. 4 shows a plan view of the CCD output diode detail. The regions 405 indicate the channel stops that define the CCD channel 412. Applying suitable clocks to the terminals 408 and 409, that are connected to the gates 402 and 403, transports charge in the register. Additional gates typically used in these structures were, for simplicity, omitted from the drawing. The important element in the structure, however, is the field plate gate 404. The field plate separates the output diode node 407 from the n+ type doping under the thick field oxide region 401. A suitable bias is applied to the gate from the terminal 411. The region 406 is either doped by n+ type doping or just by the buried channel impurities. The signal is output from the node through the terminal 410. It is obvious to those skilled in the art that the standard Floating Diffusion charge detection node can be constructed in the same manner as the output diode. The details are, for simplicity, omitted here.

Figure 5:
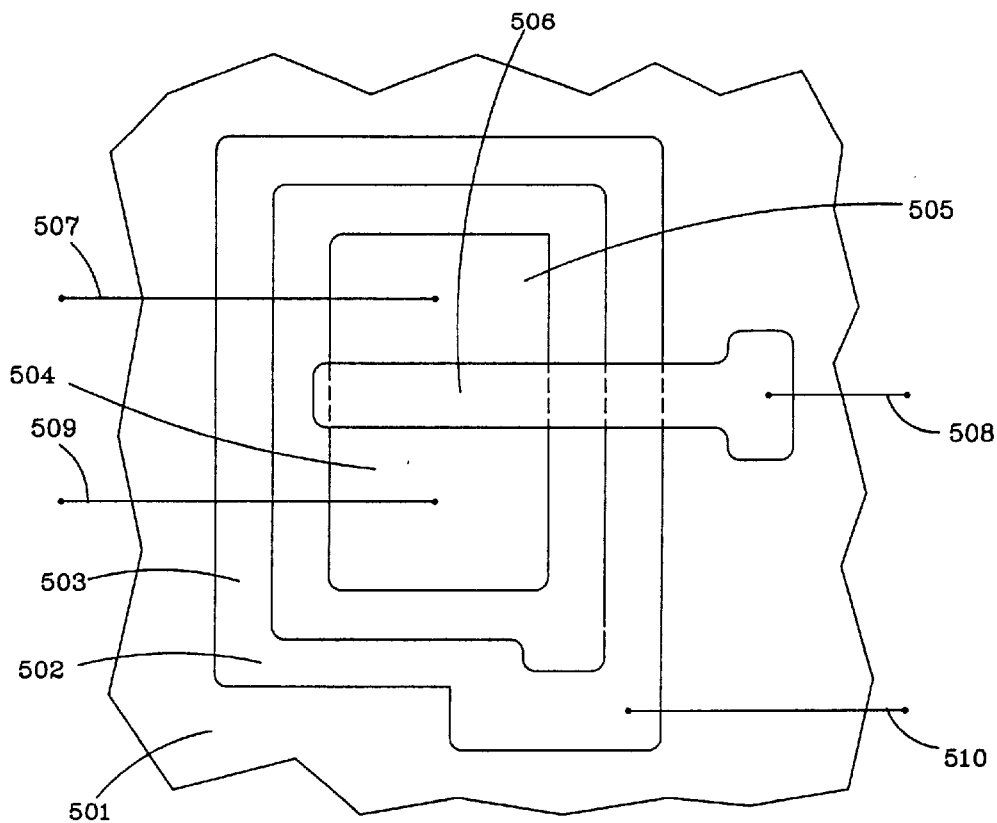
FIG. 5 is the plan view of the typical NMOS transistor used in the sensor amplifier circuits that shows the field plate electrode separating the transistor n+ source and drain regions from the n+ filed region.

The typical N-MOS transistor plan view is illustrate in FIG. 5. The key element here is again the field plate gate 503 that is connected to the terminal 510 to receive its proper bias. Suitable n+ type doping regions form a source 504 and a drain 505, which are connected to the corresponding terminals 509 and 507, respectively. The transistor gate 506 is fabricated from another level of polysilicon and is connected to the terminal 508. The region 502 can again be either doped by n+ type doping or just by the buried channel. It is obvious to those skilled in the art that many standard N-MOS type circuits, such as current source loads, source followers, amplifiers, inverters, gate drivers, and others can be easily constructed from this basic transistor element. These will not be discussed here any further.

Figure 6:
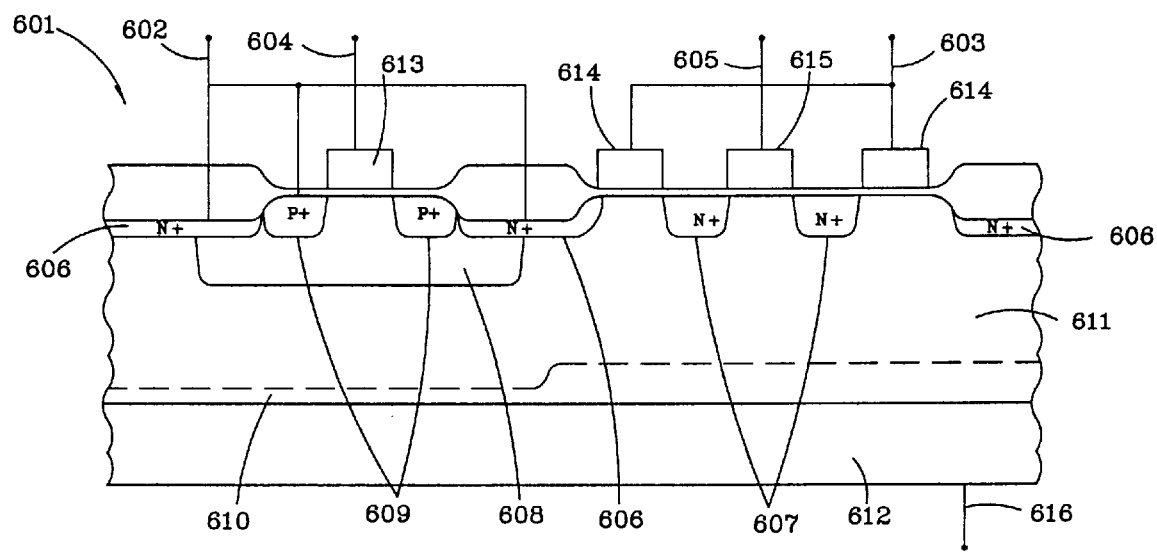
FIG. 6 represents a cross section through a typical CMOS device where inactive regions surrounding n-channel transistors are replaced by a field plate gate.

An example of yet another embodiment of the invention is given in FIG. 6. The figure represents a cross section through a generic CMOS structure 601 that shows both the p-channel and an n-channel transistor details. Such transistors can be used to build the circuits either in the active image-sensing area or in the periphery of the array. The key element here is again the field plate gate 614 that surrounds the n-channel transistors. The source-drain regions 607 and the gate 615 form the n-channel transistor. The field plate is connected to the terminal 605 to receive its bias from it. The n+ type doping covers the entire remaining inactive surface of the device. The p-channel transistors are standard and are built is a standard n type doped well 608. The regions 609 form the p-channel transistor source and drain regions with the gate 613 being connected to the terminal 604. The substrate can be negatively biased through the terminal 613 to widen the depletion layer 611. The remaining un-depleted layer 610 can thus be adjusted to be very narrow. Many types of CMOS circuits known in the art can be built using this concept. Their detail description will not be discussed here any further. Having described preferred embodiments of a novel semiconductor image sensor with improved NIR response, which are intended to be illustrative and not limiting, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed:

1. A CCD Sensor Array, comprising:
   a sensor array having n-type CCD channels fabricated on a p-type substrate;
   an n+ type peripheral region completely surrounding and contiguous to said sensor array, said n+ peripheral region being completely surrounded and separated from another p+ type peripheral region that is contiguous with the p-type substrate;
   wherein the separation between the n+ type and p+ type peripheral regions is at least partially depleted of mobile carriers by a suitable bias applied between the said p+ type and n+ type peripheral regions.

2. The sensor array according to claim 1, wherein the n+ type peripheral region contains another layer of p+ type doping at the semiconductor-dielectric interface that is contained within the n+ type peripheral regions and the n-type channels of the CCD.

3. The sensor array according to claim 1, wherein the CCD array includes at least one charge detection node contiguous to the CCD array at least partially surrounded by a field plate that is further surrounded by an n+ type peripheral region contiguous with the n+ type peripheral region of the array.

4. The sensor array according to claim 2, wherein the CCD array includes at least one charge detection node contiguous to the CCD array at least partially surrounded by a field plate that is further surrounded by an n+ type peripheral region contiguous with the n+ type peripheral region of the array.

5. The sensor array according to claim 3, wherein the at least one charge detection node is an n-type output diode.

6. The sensor array according to claim 3, including at least one n− type MOS transistor that is completely surrounded by a field plate that is further surrounded by an n+ type peripheral region, the n+ type peripheral region being contiguous with an n+ type peripheral region that surrounds an output node and the array.

7. The sensor array according the claim 6, wherein the n+ type peripheral region is completely surrounded by a p+ type peripheral region that is contiguous with an array substrate, the n+ type and the p+ type peripheral regions being separated from each other, and a bias applied between them such that the region of separation between them is at least partially depleted of mobile carriers.

8. The sensor array according to claim 4, including at least one n− type MOS transistor that is completely surrounded by a field plate that is further surrounded by an n+ type peripheral region, the n+ type peripheral region being contiguous with an n+ type peripheral region that surrounds an output node and the array.

9. A modified CMOS circuit consisting of at least one p-type transistor enclosed by an n+ type peripheral region and placed in an n-type well that is contiguous with the n+ type peripheral region, said CMOS circuit furthermore including at least one n-type transistor that is completely surrounded by a field plate, the field plate being further surrounded by the n+ type peripheral region and the substrate under the field plate in the vicinity of the n-type transistor, and at a semiconductor-dielectric interface depleted of mobile carriers.

10. The CMOS circuit according to claim 9, wherein the n+ type peripheral region is completely surrounded by and separated from another p+ type peripheral region contiguous with the substrate, the separation between the n+ type and the p+ type peripheral regions being at least partially depleted of mobile charge by a bias applied between the n+ type and p+ type peripheral regions.

11. A CCD Sensor Array, comprising:
    a sensor array having p-type CCD channels fabricated on a n-type substrate;
    an p+ type peripheral region completely surrounding and contiguous to said sensor array, said p+ peripheral region being completely surrounded and separated from another n+ type peripheral region that is contiguous with the n-type substrate;
    wherein the separation between the p+ type and n+ type peripheral regions is at least partially depleted of mobile carriers by a suitable bias applied between the said n+ type and p+ type peripheral regions.

12. The sensor array according to claim 11, wherein the p+ type peripheral region contains another layer of n+ type doping at the semiconductor-dielectric interface that is contained within the p+ type peripheral regions and the n-type channels of the CCD.

13. The sensor array according to claims 11, wherein the CCD array includes at least one charge detection node contiguous to the CCD array at least partially surrounded by a field plate that is further surrounded by an p+ type peripheral region contiguous with the n+ type peripheral region of the array.

14. The sensor array according to claims 12, wherein the CCD array includes at least one charge detection node contiguous to the CCD array at least partially surrounded by a field plate that is further surrounded by an p+ type peripheral region contiguous with the p+ type peripheral region of the array.

15. The sensor array according to claim 13, wherein the at least one charge detection node is an p-type output diode.

16. The sensor array according to claim 13, including at least one p-type MOS transistor that is completely surrounded by a field plate that is further surrounded by an p+ type peripheral region, the p+ type peripheral region being contiguous with an p+ type peripheral region that surrounds an output node and the array.

17. The sensor array according the claim 16, wherein the p+ type peripheral region is completely surrounded by a n+ type peripheral region that is contiguous with an array substrate, the p+ type and the n+ type peripheral regions being separated from each other, and a bias applied between them such that the region of separation between them is at least partially depleted of mobile carriers.

18. The sensor array according to claim 14, including at least one p-type MOS transistor that is completely surrounded by a field plate that is further surrounded by an p+ type peripheral region, the p+ type peripheral region being contiguous with an p+ type peripheral region that surrounds an output node and the array.

19. A modified CMOS circuit consisting of at least one n-type transistor enclosed by an p+ type peripheral region and placed in an p-type well that is contiguous with the p+ type peripheral region, said CMOS circuit furthermore including at least one p-type transistor that is completely surrounded by a field plate, the field plate being further surrounded by the p+ type peripheral region and the substrate under the field plate in the vicinity of the p-type transistor, and at a semiconductor-dielectric interface depleted of mobile carriers.

20. The CMOS circuit according to claim 19, wherein the p+ type peripheral region is completely surrounded by and separated from another n+ type peripheral region contiguous with the substrate, the separation between the p+ type and the n+ type peripheral regions being at least partially depleted of mobile charge by a bias applied between the p+ type and n+ type peripheral regions.

* * * * *